United States Patent [19]
Yeh

[11] Patent Number: 5,241,444
[45] Date of Patent: Aug. 31, 1993

[54] ADAPTIVE TRIP FAULT CURRENT INDICATOR

[75] Inventor: Thomas Yeh, South Weymouth, Mass.

[73] Assignee: Pacific Scientific Company, Weymouth, Mass.

[21] Appl. No.: 793,223

[22] Filed: Nov. 8, 1991

Related U.S. Application Data

[63] Continuation of Ser. No. 505,437, Apr. 6, 1990, abandoned, which is a continuation-in-part of Ser. No. 390,541, Aug. 7, 1989, Pat. No. 5,029,039.

[51] Int. Cl.$^5$ .................... H02H 2/08; H02H 3/00
[52] U.S. Cl. ........................ 361/59; 361/95; 361/93
[58] Field of Search ............ 361/59, 87, 93, 94, 361/95, 96, 98, 42; 340/664

[56] References Cited

U.S. PATENT DOCUMENTS

| | | | |
|---|---|---|---|
| 3,673,455 | 8/1972 | Dewey | 361/93 |
| 3,715,742 | 2/1973 | Schweitzer, Jr. | 361/69 |
| 3,735,248 | 2/1973 | Reese | 361/63 |
| 3,959,704 | 5/1976 | McCrea | 318/387 |
| 4,223,365 | 11/1980 | Moran | 361/96 |
| 4,543,570 | 12/1985 | Bressert et al. | 340/650 |
| 4,733,321 | 3/1988 | Lindeperg | 361/96 |
| 5,029,039 | 7/1991 | Yeh | 361/5 |

FOREIGN PATENT DOCUMENTS

| | | |
|---|---|---|
| 95590 | 2/1983 | European Pat. Off. |
| 244284 | 9/1987 | European Pat. Off. |
| 2048695 | 7/1972 | Fed. Rep. of Germany |

Primary Examiner—Steven L. Stephan
Assistant Examiner—E. To
Attorney, Agent, or Firm—Lahive & Cockfield

[57] ABSTRACT

The disclosed fault indicator which senses current in a cable, resets in response to a minimum current and arms a trip arrangement in response to current rising a predetermined amount with respect to time. If the rising current also opens a circuit breaker within a predetermined time and cuts off current to the cable, the indicator trips. If no zero current occurs within the time period, the trip arrangement is disarmed for the next current rise.

10 Claims, 6 Drawing Sheets

NORMAL

NORMAL

FAULT

NORMAL

FAULT

ADAPTIVE TRIP FAULT CURRENT INDICATOR

RELATED APPLICATIONS

This is a continuation of application Ser. No. 505,437 filed Apr. 6, 1990, now abandoned which is a continuation-in-part application of Ser. No. 390,541, filed Aug. 7, 1989, by Thomas Yeh, for Current Adaptive Fault Indicator, now U.S. Pat. No. 5,029,039.

BACKGROUND OF THE INVENTION

This invention relates to faulted current indicators, and particularly to fault indicators which can accommodate themselves to wide variations of load conditions in a distribution network.

A conventional fault indicator indicates the passage of power cable current above a predetermined magnitude, i.e. trip current. The fault indicator's trip current is selected to be greater than the expected current at the installation site. Proper selection of the trip current magnitude is very important for the proper application of fault indicators. Typically, the trip current is selected about two to three times the maximum load current and less than one half the available fault current. This method of application provides a good trade off between maximum sensitivity while minimizing the unwanted trips by periodic overloads.

Applying conventional fault indicators in a large distribution network often requires many fault indicators with different trip currents to coordinate with loading variations within the network. In addition to the cost of stocking many different fault indicators, the chance of missapplication also increases.

OBJECTS AND SUMMARY OF THE INVENTION

An object of the invention is to overcome these difficulties.

Another object of the invention is to furnish reliable fault indicators capable of adapting the trip to the load current of a power line to accommodate the wide variations in load condition of a distribution network.

According to a feature of the invention, such objects are achieved with fault indicating method and means by tripping the fault indicator in response to increases in currents in the cable over time. An example of such an increase is 50 amperes within 3 line cycles of a 60 Hz current, or 50 milliseconds.

According to another feature of the invention, the trip signal is held and the trip operation is disabled long enough for a fuse or circuit breaker to open in response to a fault, and then the trip operation enabled only if the current then falls to zero.

These and other features of the invention are pointed out in the claims. Other objects and advantages of the invention will become evident from the following detailed description of preferred embodiments of the invention when read in light of the following drawings.

DETAILED DESCRIPTION OF PREFERRED EMBODIMENTS

Figure 1:
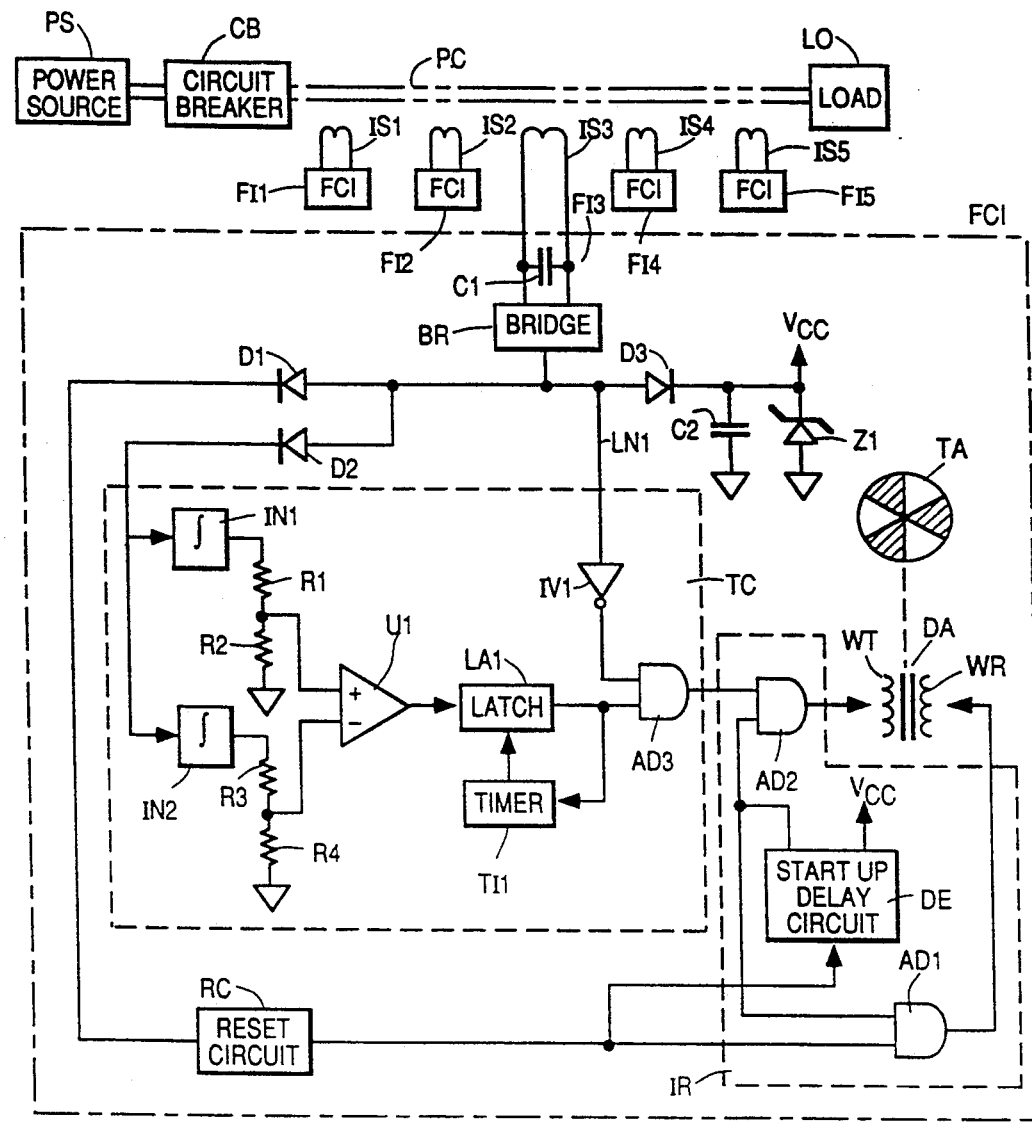
FIG. 1 is a block diagram illustrating an embodiment of the invention.

FIG. 1 illustrates an embodiment of the invention. In FIG. 1 a power source PS energizes a load LO through a circuit breaker CB and a power cable PC. Fault indicators FI1, FI2, FI3, and FI4 inductively coupled to the cable PC by inductive sensors IS1, IS2, IS3, and IS4 at spaced locations along the cable PC, sense whether a fault exists at positions between any fault indicators. The sensors IS1 to IS5 may be regarded as part of the fault indicators FI1 to FI5. A fault between fault indicator FI4 and fault indicator FI5 trips fault indicators FI1 to FI4 while leaving fault indicator FI5 reset. This identifies the location of the fault as being between fault indicator FI4 and fault indicator FI5. The length of the cable PC appears shortened for the purposes of illustration. Although only fault indicator FI3 is shown in detail, the other fault indicators are substantially identical thereto.

The inductive sensors IS1 to IS5 produce respective alternating voltages corresponding in amplitude to the amplitude of the alternating currents they sense in the cable PC. In the fault indicator FI3, a capacitor C1 tunes the inductive sensor IS3 to the frequency in the cable PC. A bridge circuit BR rectifies the alternating current in the sensor IS3 to form an output voltage whose peak is proportional to the current flowing in the power cable 16. Three isolating diodes D1, D2, and D3 furnish the bridge BR output voltage to a reset circuit RC, a trip circuit TC, and a power circuit PO that furnishes a voltage Vcc to the elements of the fault indicator. The diodes D1, D2, and D3 isolate the various circuits from each other.

In the power circuit PO a capacitor C2 captures the peak of the rectified output of the bridge BR and smoothes ripple. A 12 volt zener diode Z1 regulates the voltage across the capacitor C2 so the latter carries a 12 volt potential that serves as the voltage source Vcc for elements of the circuit in the fault indicator FI3.

In the fault indicator FI3, the reset circuit RC responds to a minimum voltage Vmin at the bridge BR to produce a reset signal. The minimum voltage Vmin corresponds to a minimum current Imin in the cable PC. The reset signal energizes a reset winding WR in a fault display actuator DA which then drives a target (or display) TA to a visibly distinguishable reset position.

The trip circuit TC operates in response to the voltage at the bridge BR appearing at the diode D2 and representing the operating current in the cable PC. The trip circuit TC produces a trip signal when the rate of change of current in the cable PC causes the rate of change of the voltage at the bridge BR to exceed a predetermined value, and the cable current thereafter drops to 0 within a predetermined time in response to the current opening the circuit breaker CB. The trip signal energizes a winding W2 in the display actuator DA. The latter turns the target to a trip position.

An inrush restraint circuit IR between the reset circuit RC and the winding W1, and between the trip circuit TC and the winding W2 prevents the display actuator DA from either resetting or tripping for a preset time after the onset of the minimum voltage Vmin at the reset circuit RC. A sample preset time is ¼ to ½ cycles. However for particular purposes other delays are useful. According to one embodiment of the invention the preset time is 60 seconds.

Reset circuits such as circuit RC are well known in the art. They include a threshold circuit to establish the reset signal or signals when the voltage at the bridge BR exceeds the minimum value Vmin.

In the inrush restraint circuit IR a start up delay circuit DE responds to the onset of the voltage Vcc and a reset signal and produces an inhibiting low at one input of AND gates AD1 and AD2 for the preset time such as one-quarter or one half cycles or perhaps 60 seconds. Thereafter, the start up delay circuit DE enables the gates AD1 and AD2 until three events occur; the current in cable PC drops to 0 to expunge Vcc, the current resumes to re-produce Vcc, and a reset signal appears at the start up delay circuit DE. The start up delay circuit DE is in the form of a timer responsive to a reset signal followed by a latch that resets in the absence of Vcc and is enabled by the presence of Vcc.

The other input of the gate AD2 is connected to the output of the reset circuit RC, and the other input of the AND gate AD2 is connected to the trip circuit TC. The AND gate AD1 serves to energize the reset winding W1 when the input signal at both inputs are high. The AND gate AD2 serves to energize the trip winding when both inputs are high. The start up delay circuit DE causes the inhibit signal at the inputs of AND gates AD1 and AD2 to last for a given time, such as one-quarter or one-half cycle, and then enables the AND gates AD1 and AD2 so they can pass reset or trip signals. In this way the inrush restraint circuit prevents resets or trips in response to inrush currents.

In FIG. 1, the trip circuit produces a trip signal in response to the rate of change of current. In the trip circuit TC an integrator IN1 integrates the rectified voltage at the bridge BR at a first rate and an integrator IN2 integrates the voltage at a second rate much slower than the first rate. A voltage divider composed of resistors R1 and R2 takes a slightly lower proportion of the output of integrator IN1 than does a voltage divider composed of resistor R3 and R4 take of the integrator IN2. Thus the effective output of the integrator IN2 measured at the voltage divider R3,R4 produces a slightly higher absolute voltage than the effective voltage of integrator IN1 measured at voltage divider R1,R2.

A comparator U1 compares the voltages at divider R1,R2 with the voltages at divider R3,R4. When the voltage at capacitor C2 is changing only slowly, the output of the comparator U1 is low because the both integrators' effective outputs respond similarly to their inputs and the effective output of integrator IN1 is lower than that of integrator IN2. When the voltage at the bridge BR rises rapidly, the lower effective output of faster integrator IN1 climbs above the effective output of integrator IN2. The comparator U1 then produces a high. A latch LA1 such as a flip-flop latches the high and applies the high to an input of an AND gate AD3. A timer TI1 responds to the high and resets the latch after a predetermined time such as one minute. The timer TI thus allows the comparator U1 to arm the AND gate AD3 and hence the trip winding WT for only the predetermined time, e.g. one minute.

An inverter IV1 produces an inhibit signal at the other input of the AND gate AD3 as long as there exists a voltage at the bridge BR. As soon as the voltage at the bridge BR goes to 0 in response to the circuit breaker CB opening the cable PC the inverter applies a high to the AND gate AD3. If this occurs within the predetermined time, e.g. one minute that the timer TI1 allows the latch LA1 to apply a high to the AND gate AD3 the latter goes high. If this high occurs after the inrush restraint period of the start up delay circuit DE, i.e. after the start up delay circuit places highs on AND gates AD1 and AD2, the high at AND gate AD3 causes energization of winding W2.

Figure 2:
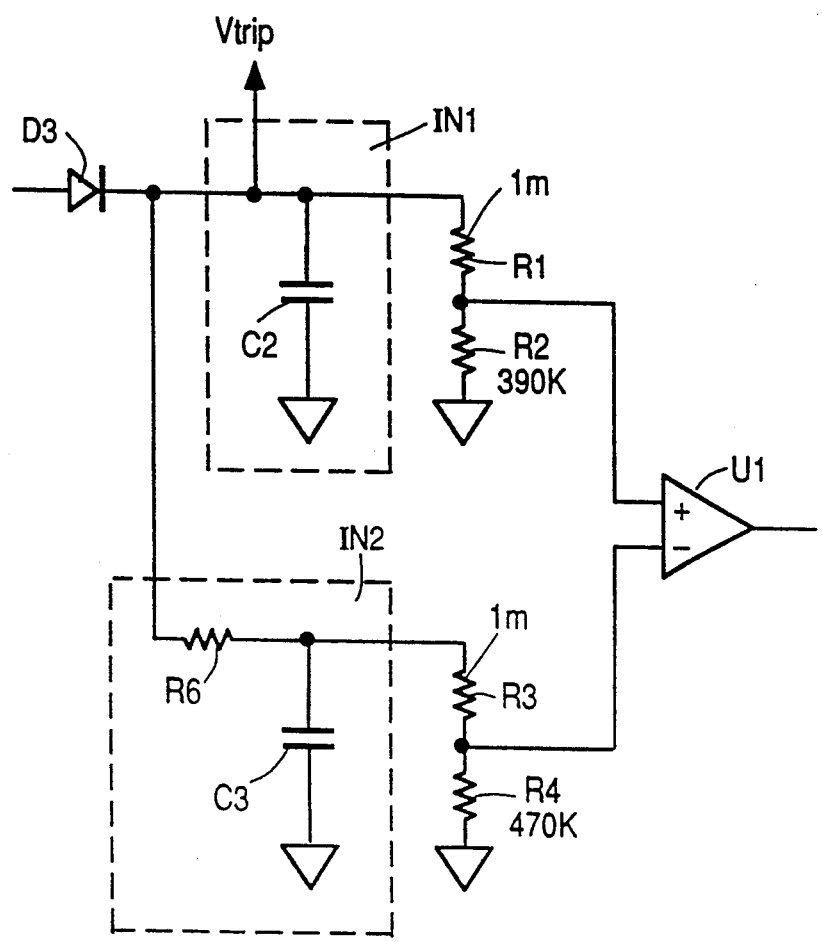
FIG. 2 is a detailed showing of a portion of the circuit in FIG. 1.

FIG. 2 illustrates details of the integrators IN1 and IN2 and their environments. Here, a capacitor C2 forms the integrator IN1. The time constant of the integrator IN1 is determined mainly by the capacitor C2 and the effective impedance of the resonant circuit composed of the inductive sensor IS3 and the capacitor C1 which tunes the sensor IS3 to the frequency of the current in the cable PC.

The values are chosen so that the voltage Vtrip across the capacitor C2 reaches 95% of the voltage of the bridge BR in about 3 line cycles. According to one embodiment of the invention the capacitor C2 has a value of 4.7 microfarads and the effective impedance a value 3 Kohm although these values are only examples.

A capacitor C3 and a resistor R6 form the second integrator IN2. According to one embodiment of the invention the capacitor C3 has a values such as 1.0 microfarad while the resistor R6 has a value of 15 Kohms. Because the resistor R6 and the capacitor C3 are both connected to the capacitor C2 and the impedance of the tuned circuit C1,IS3, the time constant of the second integrator IN2 includes the effects of the tuned circuit impedance and the capacitor C2. Hence, the time constant of the integrator IN2 is inherently greater than the time constant of integrator IN1. The values of the integrator IN2 are chosen to allow the voltage across capacitor C3 to reach 95% of the voltage at the bridge BR 3 cycles later than the time the voltage across capacitor C2 reaches 95% of the voltage across bridge BR.

Figure 3:
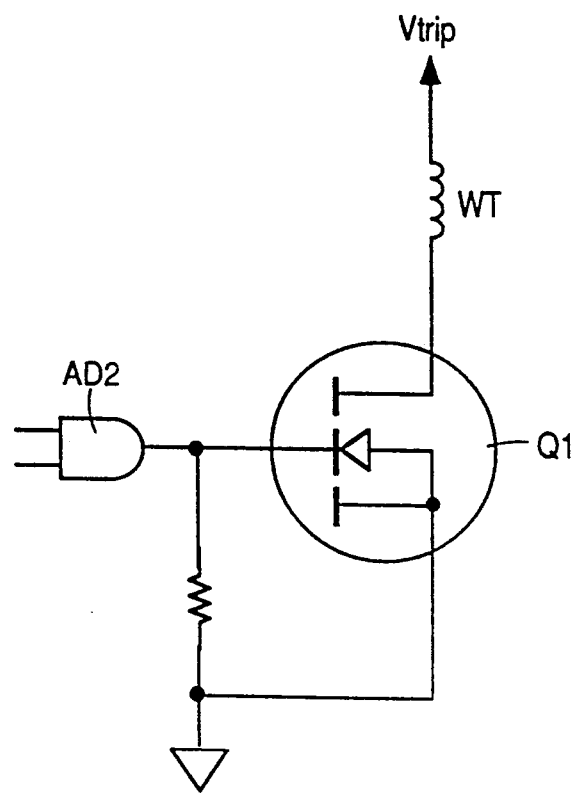
FIG. 3 is a circuit diagram illustrating details of part of the circuitry in FIG. 1.

The very high values of resistors R1 to R4 affect the time constants of the integrators IN1 and IN2 only slightly. However their voltage dividing ratios are such as to apply a smaller proportion of the signal at the output of integrator IN1 than that of integrator IN2. This assures that the faster input from integrator IN1 to the non-inverting terminal of the comparator U1 is less than the slower input from the integrator IN2 to the inverting terminal as long as the currents sensed are varying slowly enough for both integrators IN1 and IN2 to follow The capacitor C2 serves two other functions. It serves to reduce the ripple at the bridge BR and to store a voltage Vtrip for energizing the trip winding WT. FIG. 3 illustrates the manner in which the trip signal energizes the trip winding WT. Here, a field effect transistor Q1 has a gate which receives the trip signal from the AND gate AD2. A high trip signal causes current flow from along a path from the voltage Vtrip at the capacitor C2 through the trip winding WT, the drain and source of field effect transistor Q, and ground.

A similar arrangement energizes the reset winding at the output of AND gate AD1.

The integrators IN1 and IN2 and the comparator U1 may be considered as functioning as a differentiator for that responds only to positive di/dt or dv/dt. They may also be regarded as a differentiator followed by a diode that permits only positive flow.

In operation, the inductively coupled sensor IS3 senses the current in the power cable PC on a continuous basis. The bridge BR rectifies the output of the current sensor IS3 to obtain unidirectional sine pulses with peak values proportional to the current magnitude in the power cable PC. The integrator IN2 with its capacitor C3 and longer time constant than the integrator IN1 generates the reference for the comparator circuit U1. The time constant of the integrating circuit IN2 is such that the reference of the comparator represents some time average current of the power cable, for example, three line cycles, or 50 milliseconds.

The time constant of the integrating circuit IN1 is less than that of IN2. The effective output of the integrator IN1 is slightly lower than the integrator IN2 as long as the rate of change in the sensed current is slower than the differences between the charging rates of the capacitors in the integrators IN1 and IN2. This is so because then both integrating circuits IN1, and IN2 keep up with the rate of change at the output of the bridge circuit BR. When the current in the power cable PC exhibits a rate of change that is faster than that of the integrator IN2, the integrator IN1 reacts faster than the integrator IN2 and a voltage differential occurs at the inputs of the comparator U1.

When the current increase in the power cable PC is sufficient to raise the output of integrator IN1 fast enough to overcome the threshold established by the effective output of the integrator IN2, the result triggers the output of comparator U1. The comparator U1 then sets the latch LA1 and initiates the timer circuit TI1 and provides a high at the input of the AND gate ND3.

An inverter IV1 disables the AND circuit AD3 as long as the bridge circuit BR indicates that current continues to flow in the cable PC. The timer maintains the high at the output of the latch LA1 for a predetermined period. If the current in the line PC drops to zero during that period, the inverter IV enables the AND gate AD3 to pass a trip signal to the winding W2.

Figure 4:
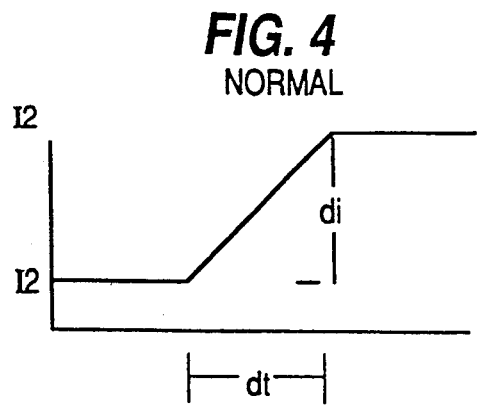
FIG. 4 is a graph showing the operation of the circuit in FIG. 1.
Figure 5:
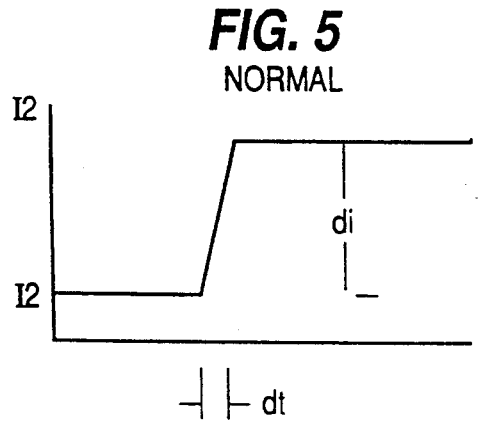
FIG. 5 is a graph showing the operation of the circuit of FIG. 1.
Figure 7:
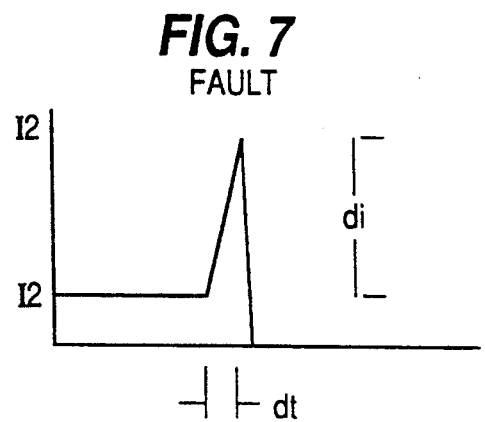
FIGS. 7 and 8 are time current diagrams illustrating conditions for tripping the fault indicator.
Figure 6:
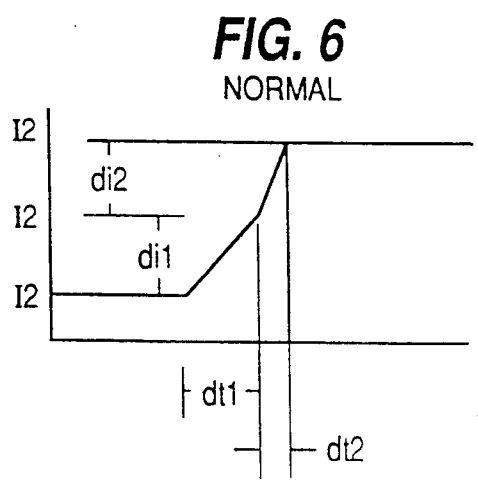
FIG. 6 is a graph showing the operation of the circuit of FIG. 1.
Figure 8:
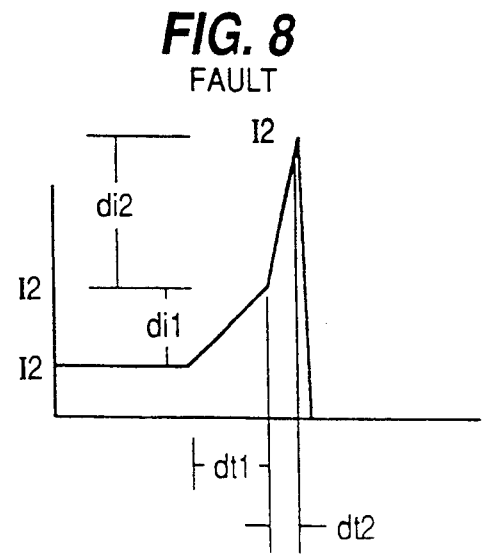

FIGS. 4, 5, and 6 demonstrate conditions that will not cause a trip operation. FIGS. 7 and 8 show conditions for tripping the fault indicator. In FIG. 4, the initial "nominal" current I1 is the relative reference for the fault determination. The current increase from I1 to I2 is over a relatively long enough period of time (dt) so that its rate of change is insufficient to cause a trip operation. At the end of the time (dt), the fault indicator is referenced to I2 for the fault operation.

In FIG. 5, the increase in the magnitude of the current over time is sufficient to trip the fault indicator. However, in FIG. 5, the current remains at I2 after the increase, thereby indicating that the circuit breaker CB did not interrupt the current in the power cable PC and the entire trip condition was not satisfied. FIG. 7 shows the current dropping to zero after reaching I2, thereby indicating the loss of current in the power cable PC, thereby tripping the fault indicator.

FIG. 6, shows a condition where the fault indicator adapts to the variations in the load current. Initially, the power cable PC carries current of the level I1. Similar to FIG. 4, the current is increasing in response to an increase in load. During the time when the current is changing from I1 to I3 over the period dt1, the reference against which the fault is judged is also changing. The fault indicator is "adapting" to the changing load current. At the end of the time dt1 the fault indicator is referenced to I3. The subsequent current increase of I3 to I2 over the time period dt2 is not sufficiently high relative to I3 to arm the trip circuit.

FIG. 8 shows the condition where an increase is sufficiently fast relative to I3 to arm the trip circuit. The trip operation occurs when the breaker CB interrupts the line current after the arming condition. The loss of current represents this in FIG. 8.

The adaptive fault indicator operates to trip when the increase of current in the power cable PC, as referenced to the steady state "nominal" load current is sufficiently high and is over a short enough period of time to generate the necessary di/dt value to arm the trip circuit. If the line voltage or current signal is not available, the arming of the trip circuit will cause the target TA to operate to trip. If line current is available, then the line current must also be interrupted within a period of time such as one minute to enable the trip circuit to operate to trip. If the line current is still present after a given time such as one minute, the latch LA1 produces a low and then disables the AND gate AD3 so that the trip circuit is disarmed and ready for the next trip condition.

The adaptive fault indicator adapts to the nominal loading current of the power line to accommodate the wide variations of load conditions in a distribution network. The fault indicator according to the invention does not react to absolute magnitude of current but instead responds to increase in current over period of time (di/dt). The adaptive fault indicator uses the nominal load current as a reference to which a relative increase of current such as 50 amperes within a certain amount of time such as three cycles or 50 milliseconds will cause the indicator to trip. Fault indicators according to the invention thus significantly reduce stocking of fault indicators having different trip setting and thus reduce the chances for misapplication.

According to an aspect of the invention, two events must occur in sequence to cause the indicator to trip, for example a relative increase in current such as 50 amperes within three cycles "arms" the trip circuit. The second event, namely the loss of current within a predetermined time, such as one minute. This will trip the indicator. If after one minute the current in the line still persists, the trip circuit will be "disarmed". The timing is chosen to be longer than the opening time of the circuit breaker CB in the power line PC. If the circuit breaker includes a recloser switch, then the time of timer TI1 should be chosen to be longer than the final lockout time. The purpose of the timer TI1 is to prevent the fault indicator from responding to current before the line protection device has a chance to operate. This is especially true for a recloser breaker where the line voltage disappears and appears upon open and reclose of the breaker. The timer T1 will then hold the trip circuit until the breaker has a chance to lock-out before deciding to trip. Upon starting of current, or any resumption of current, the reset circuit RC responds to a current Imin and initiates the start up delay circuit DE in the inrush restraint IR. The time of the delay is preferably short, for example one quarter to one half cycle. However, delay times of 60 seconds are sometimes used for special purposes. The start up delay circuit DE inhibits the AND gates AD1 and AD2 at the initiation or resumption of current and prevents the display actuator DA from changing the reset or trip condition of the target TA for the delay time. Thereafter, the start up delay circuit DE enables the AND gate AD1 and AD2 and allows them to pass highs to the windings WR and WT.

The capacitor C2 serves three purposes. First, it converts the full wave sine pulses into low ripple DC voltage. It also stores the necessary energy to activate the trip winding WT in the display actuator DA. Its third function is to serve as an integrating member in the integrator IN1.

Figure 9:
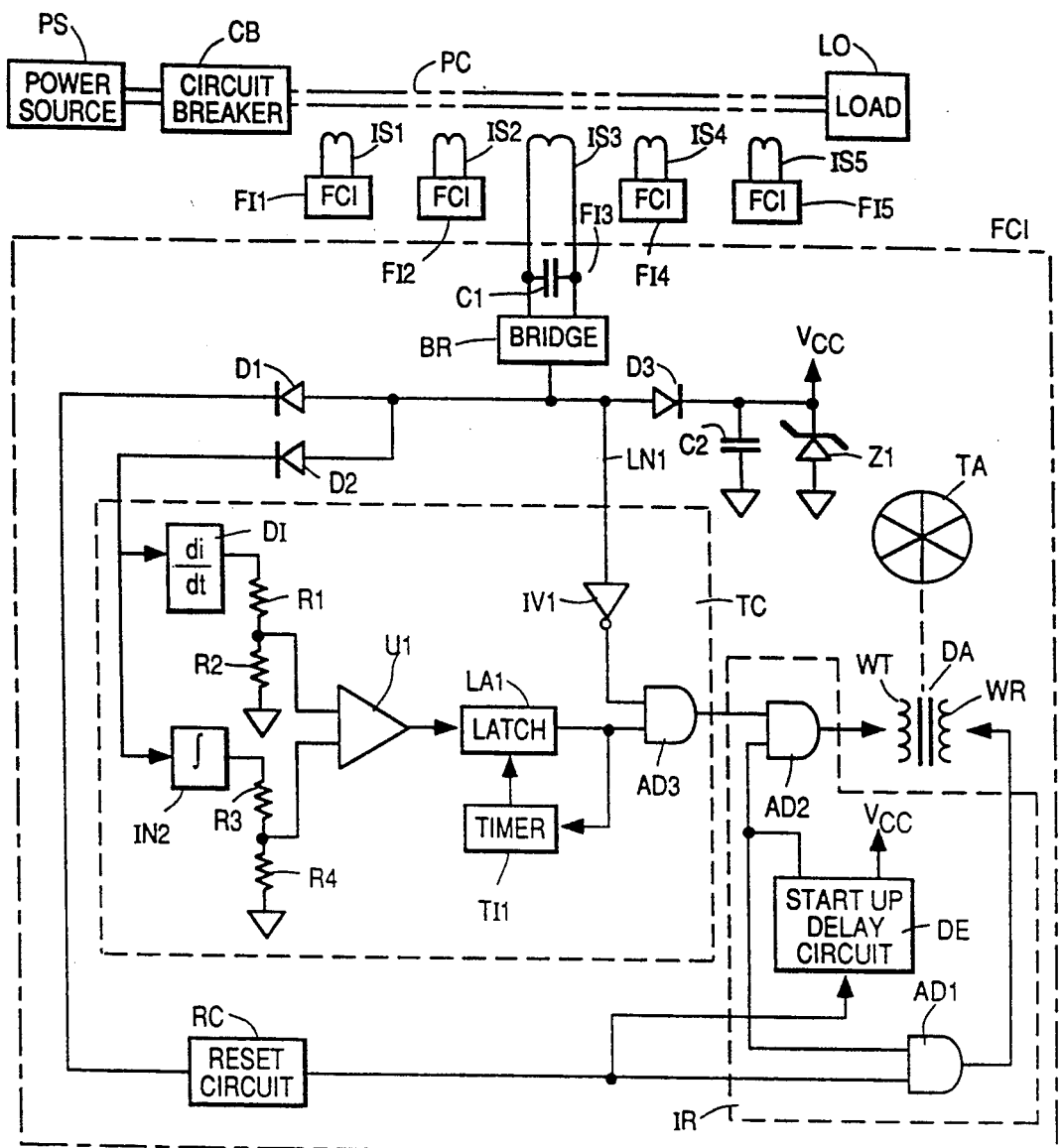
FIG. 9 is a block diagram illustrating another embodiment of the invention.

The invention may also be embodied as shown in FIG. 9. Here, a differentiator DI substitutes for the integrator IN1. The differentiator produces signals proportional to the rate of change of the output of the bridge circuit BR. A large rate of change at the output of the bridge circuit BR produces a large output at the differentiator DI. A smaller rate of change produces a comparatively smaller output. A comparator U1 compares the differentiating circuit DI output to the nominal current based reference in integrator IN2. The integrator IN2 here has a time constant that depends mainly on the members within it. The threshold of the comparator is such that rate of change in current, say an increase of 50 amperes over three cycles, triggers the comparator output. This output arms the trip circuit and initiates the timer circuit TI1.

The circuits IN1 and IN2 may be regarded as energy storage devices with different storage rates. In that sense the circuit IN2 has the faster storage rate. The integrator circuits IN1 and IN2 may also be considered delay circuits having information storage functions with different write delay times. In that sense the circuit IN2 has the longer delay time. As such the information storage aspects of circuits IN1 may be replaced for example with semiconductor memories.

Figure 10:
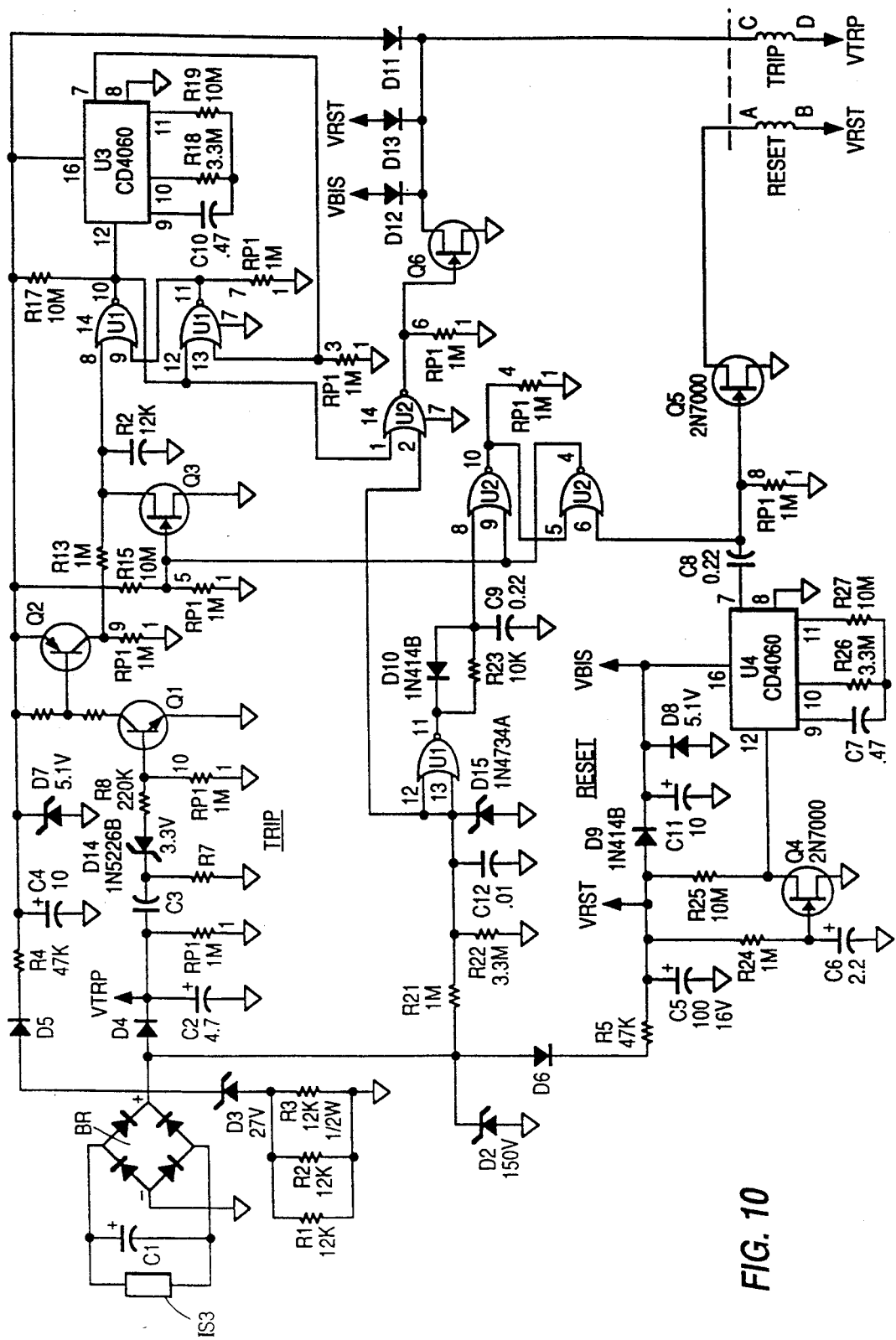
FIG. 10 is a schematic diagram illustrating yet another embodiment of the invention.

Another embodiment of the invention appears in FIG. 10. Here, the sensor SI3 output, after full wave rectification, is peak detected by capacitor C2. The DC voltage across capacitor C2 is proportional to the current magnitude being sensed by the sensor SI3. The charging time constant of capacitor C2, composed of the equivalent impedance "looking back" into the terminals of the sensor SI3 coil and the capacitance of capacitor C2, allows the DC voltage across capacitor C2 to capture the peak amplitude of the 60 Hz current. The discharge time constant of capacitor C2, determined by resistance of resistor R6 and capacitance of capacitor C2, is much longer than 60 cycles period to hold the information between 60 Hz period.

The rate-of-increase of the DC voltage across capacitor C2 is derived by the differentiator circuit composed of capacitor capacitor C3 and resistor R7. For this case capacitor C3 is 1 microfarad and resistor R7 is approximately 50K ohms. The "differentiator" formed by capacitor C3 and resistor R7 has a time constant of approximately three cycles of the 60 Hz signal or 50 milliseconds. When the sensed 60 Hz current exhibits an increase that occurs within three 60 Hz cycles, the voltage across capacitor C2 also exhibits a corresponding increase. The output of the differentiator, at the cathode of zener diode D14, is proportional to the rate-of-increase of the voltage across capacitor C2.

When the rate-of-increase is sufficient in rate and magnitude, the output of the differentiator will overcome the zener diode voltage D14 and turn ON transistor Q1. The collector of transistor Q1 will go low and turn on transistor Q2. The collector of transistor Q2 is tied to the SET input of the SET/RESET Flip Flop and initiates the counter IC U3. The counter IC U3 then counts for a predetermined time period. During this period the trip circuit is enabled at pin 1 of gate U2. If during this time the line current drops to zero as detected by resistor R21, resistor R22, and capacitor C12, pin 3 of gate U2 will go high and turn on the trip driver transistor Q6 to turn the display actuator into FAULT registration. Diodes D11, D12, and D13 will discharge all of the internal energy storage capacitor to prevent the circuit from reset and re-initiate the circuit into a predictable state. If the sensed current did not decay to zero before the counter IC U3 times out, the SET/RESET Flip Flop is reset and the trip circuit returns to nominal state.

The voltage supply for the trip circuit includes diode D5, resistor R4, capacitor C4, and diode D7.

In the reset circuit, the reset time delay provided by U4 also serves as the inrush restraint timer. At start up, the sensor output charges the reset energy storage capacitor capacitor C5. When the magnitude of the sensed current produces sufficient voltage across capacitor C5, transistor Q4 is turned ON by resistor R24 and capacitor C6 and enables the reset timer IC U4. Another SET/RESET Flip FLop is SET by detecting the presence of line current and disables the adaptive trip circuit by turning transistor Q3 on and clamp the SET terminal of the trip Flip Flop low. When the reset/inrush restraint time elapses, the timer IC U4 produces a high at pin 5 of U4 which cause the RESET Flip Flop to release transistor Q3 and enables the adaptive trip circuit.

While embodiments of the invention have been described in detail, it will be evident to those skilled in the art that the invention may be embodied otherwise.

What is claimed is:

1. A fault indicator comprising:
sensing means for sensing current in a cable;
reset means responsive to said sensing means for producing a reset indication in response to a minimum current; and
trip means responsive to said sensing means for producing a trip indication in response to both the current rising a predetermined amount with respect to time and a subsequent drop to substantially zero;
said trip means including current adapting means responsive to the current sensed by said sensing means for setting a base load from which the current must rise for the predetermined amount with respect to time.

2. A fault indicator as in claim 1, wherein:
said trip means includes:
rate detecting means responsive to said sensing means for detecting a selected rate of current rise above a given rate;
zero detecting means responsive to said sensing means for detecting a zero current in the cable after said rate detecting means detects the selected rate.

3. A fault indicator as in claim 1, wherein said trip means includes:
first integrating means having a first integrating rate;
second integrating means having a second integrating rate slower than said first integrating rate;
comparator means for comparing a smaller proportion of the first integrating means with a larger proportion of the second integrating means for producing a first signal when the smaller proportion exceeds the larger proportion;

latching means for latching the output of the comparator means in response to the first signal;

means responsive to the drop in current to substantially zero and to said latching means for producing a trip signal for a trip indication.

4. A fault indicator as in claim 3, wherein:

said trip means includes a timer coupled to the output of said latching means for unlatching said latching means after a predetermined period.

5. A fault indicator as in claim 1, wherein said trip means includes:

differentiating means having a differentiating rate;

integrating means having an integrating rate slower than said differentiating rate;

comparator means for comparing the differentiating rate with the integrating rate of said integrating means for producing a first signal when an output of the differentiating means exceeds an output of the integrating means; and means responsive to the drop in current to substantially zero and to said first signal for producing a trip signal for a trip indication.

6. A fault indicator as in claim 5, wherein said trip means includes:

latching means for latching the output of the comparator means in response to the first signal and applying the latched first signal to said means responsive to the drop in current to zero.

7. A fault indicator as in claim 6, wherein:

said trip means includes a timer coupled to the output of said latching means for unlatching said latching means after a predetermined period.

8. A fault indicator as in claim 1, wherein said trip means includes:

differentiating means having a differentiating rate and coupled to said sensing means;

a Zener diode coupled to the output of said differentiating means for producing a first signal when an output of said differentiating means exceeds a threshold of said Zener diode; and means responsive to the drop in current to substantially zero and to said first signal for producing a trip signal for a trip indication.

9. A fault indicator as in claim 8, wherein said trip means includes:

latching means for latching the output of the differentiating means in response to the first signal and applying the latched first signal to said means responsive to the drop in current to zero.

10. A fault indicator as in claim 9, wherein said trip means includes:

said trip means includes a counter coupled to the output of said latching means for unlatching said latching means after a predetermined count.

* * * * *